(12) United States Patent
Muenter et al.

(10) Patent No.: US 7,561,090 B1
(45) Date of Patent: Jul. 14, 2009

(54) FOCAL PLANE ARRAY WITH SERIAL, VARIABLE BIT WIDTH ANALOG TO DIGITAL CONVERTER

(75) Inventors: Steven Edward Muenter, Van Nuys, CA (US); Richard H. Burns, North Hollywood, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/968,782

(22) Filed: Jan. 3, 2008

(51) Int. Cl.
*H03M 1/12* (2006.01)
(52) U.S. Cl. ...................... 341/155; 341/120
(58) Field of Classification Search ............... 341/172, 341/166, 155, 139, 120
See application file for complete search history.

(56) References Cited

U.S. PATENT DOCUMENTS

| 5,084,704 | A | 1/1992 | Parrish |
| 5,801,657 | A | 9/1998 | Fowler et al. |
| 6,545,624 | B2 * | 4/2003 | Lee et al. ............... 341/155 |
| 6,670,904 | B1 * | 12/2003 | Yakovlev ............... 341/167 |
| 6,956,413 | B2 * | 10/2005 | Bailey .................. 327/131 |
| 7,095,355 | B1 * | 8/2006 | Graham et al. .......... 341/169 |

FOREIGN PATENT DOCUMENTS

WO    WO2007-000692    1/2007

OTHER PUBLICATIONS

Yang et al., "A Nyquist-Rate Pixel-Level ADC for CMOS Image Sensors", IEEE Journal of Solid-State Circuits, vol. 34, No. 3, Mar. 1999, pp. 348-356, Santa Clara, California.

* cited by examiner

*Primary Examiner*—Brian Young
(74) *Attorney, Agent, or Firm*—Yee & Associates, P.C.; Charles S. Gumpel

(57) ABSTRACT

A method and apparatus for a focal plane array with serial, variable bit width analog to digital converter. The focal plane array includes a plurality of pixels and a dynamically reconfigurable analog to digital converter. The controller determines a number of digital output bits required to generate digital output at a selected conversion resolution. A sample and hold circuit holds an analog voltage from a pixel to form a captured analog signal. A one-bit converter stage processes an instance of a captured analog signal to generate an output bit. The controller iteratively processes a residue voltage through the one-bit converter stage a number of times required to generate the number of digital output bits to form a digital output with the user defined conversion resolution.

20 Claims, 9 Drawing Sheets

FOCAL PLANE ARRAY WITH SERIAL, VARIABLE BIT WIDTH ANALOG TO DIGITAL CONVERTER

CROSS-REFERENCE TO RELATED APPLICATIONS

The present disclosure is related to the following application entitled Analog to Digital Converter with Dynamically Reconfigurable Conversion Resolution, application Ser. No. 11/968,917, filed on Jan. 2, 2008, assigned to a common assignee, and incorporated herein by reference.

BACKGROUND INFORMATION

1. Field

The present disclosure relates generally to focal plane arrays. More particularly, the present application is directed to a method and apparatus for a focal plane array with serial analog to digital converters with dynamically reconfigurable conversion resolution.

2. Background

A focal plane array is an image sensing device consisting of an array of light-sensing pixels at a focal plane of a lens. Focal plane arrays are used for a variety of purposes, such as, without limitation, imaging purposes, spectrometry, wavefront sensing, and scanning arrays. Focal plane arrays are frequently used in video cameras and other imaging devices.

For example, video cameras in machine vision applications frequently utilize focal plane arrays. These video cameras can generate vast amounts of digital streaming data. The data rate in units of bits per second is determined by the number of frames per second that the camera can capture, multiplied by the number of pixels per frame, and multiplied by the number of bits per pixel. The number of bits per pixel is determined by the data width of the analog to digital converter used by the focal plane array, and is fixed by the hardware to a value that gives the maximum gray scale resolution that the focal plane can offer above the noise floor of the focal plane array.

It is often desirable to acquire data at the maximum possible frame rate of the camera for applications such as closed loop optical tracking and low latency image analysis. Although the number of bits per pixel is fixed, the frame rate must be slowed down so that the amount of data generated by the camera does not exceed the bandwidth of the data link.

However, many image processing applications do not require the full gray scale resolution. Often, in machine vision applications such as object counting, edge detection, or optical character recognition, the video image is "binarized" to only one bit of information per pixel. This operation is usually performed on the data by a video processor after the data has been transmitted through the data link. The full bandwidth of the data link is required for the data transfer even though only a small fraction of the data is actually used. If the gray scale resolution of the camera is not altered for applications that do not require the full gray scale resolution, unnecessary data bits are generated which results in a slower and less efficient process than is necessary.

High frame rate cameras typically use high speed serial data links. For example, the CamLink standard allows the use of multiple parallel data channels to accommodate the high bandwidth requirement. However, the use of multiple parallel data channels requires more interconnections and more electronic drivers and receivers. In addition, synchronizing the parallel data streams can be complicated. The video data from the camera may be processed using algorithms that do not require the full gray scale resolution of the camera. This operation is typically performed by a microprocessor after the full gray scale analog to digital converted data is transferred through the data link. The added bandwidth of the data link is necessary for the data transfer even though most of the information is unused.

If the bandwidth of the data channels is still insufficient to accommodate the streaming data from the focal plane array, it is a common practice to reduce the number of pixels per frame by windowing the focal plane array to a specific region of interest (ROI). This windowing function is typically performed by the readout electronics of the focal plane array. If the focal plane array is operated in a windowed mode, the frame rate may be increased to utilize the maximum available bandwidth, but any visual stimulus occurring outside the region of interest will be missed.

In another solution, cooled infrared cameras bring the analog pixel data to analog to digital converters that are located away from the temperature controlled area. However, the physical size and wiring requirements of these external analog to digital converters associated with cooled infrared cameras may result in significant disadvantages.

Moreover, existing analog to digital converter topologies may consume a significant amount of power and may occupy a large amount of die area. This may make the integration of analog to digital converters into focal plane array readout electronics difficult or impractical. In addition, infrared focal plane cameras are typically cooled, so the added heat generated by the analog to digital converters generally necessitates their placement away from the temperature controlled area. Thus, current solutions frequently do not integrate analog to digital converters into focal plane array readouts.

Accordingly, there is a need for a method and apparatus for integrating analog to digital converters into the readout electronics of an infrared focal plane array while minimizing the analog signal path and reducing noise susceptibility, which overcomes the problems discussed above. Embodiments of the disclosure are intended to satisfy this need.

SUMMARY

An embodiment of the present disclosure provides a dynamically reconfigurable focal plane array. The dynamically reconfigurable focal plane array includes a plurality of segments, a plurality of analog to digital converters with dynamically reconfigurable conversion resolution, a parallel to serial converter, a controller, and an analog multiplexer.

Each segment in the plurality of segments comprises at least one pixel. Each analog to digital converter in the plurality of analog to digital converters is associated with a segment in the plurality of segments. Each analog to digital converter receives an analog voltage from a first selected pixel in the segment associated with the each analog to digital converter. The parallel to serial converter receives an output bit from the each analog to digital converter in the plurality of analog to digital converters in parallel.

The parallel to serial converter generates a serial data output signal. The controller dynamically configures a selected conversion resolution of the each analog to digital converter. The analog multiplexer selects a next pixel in the segment associated with the each analog to digital converter when a number of bits needed to generate digital output with the selected conversion resolution is generated for the first selected pixel.

In another advantageous embodiment, a dynamically reconfigurable focal plane array is provided. The focal plane array includes a plurality of pixels, an analog to digital converter, and a controller. A pixel in the plurality of pixels generates an analog voltage. The analog to digital converter receives the analog voltage from the pixel.

In this embodiment, the analog to digital converter includes a sample and hold circuit and a one-bit converter stage. The sample and hold circuit holds the analog voltage to form a captured analog signal. The one-bit converter stage generates a first output bit and a residue voltage in response to processing the captured analog signal. The one-bit converter stage iteratively processes the residue voltage a given number of times to form a given number of additional bits. The first output bit and the given number of additional bits form a digital output with a dynamically reconfigurable conversion resolution.

The controller identifies a number of output bits required to generate the digital output at the dynamically reconfigurable conversion resolution. The controller iteratively processes the captured analog signal and the residue voltage through the one-bit converter stage to generate the number of output bits to form the digital output with the dynamically reconfigurable conversion resolution.

Yet another advantageous embodiment provides a method for dynamically reconfiguring a gray scale resolution of digital output generated by a focal plane array. A controller identifies a number of output bits required to generate a digital output with a selected conversion resolution. An analog to digital converter receives an analog voltage from a first selected pixel in a plurality of pixels. A sample and hold circuit associated with the analog to digital converter holds the analog voltage to form a captured analog signal. The captured analog signal is processed through a one-bit converter stage to form a first output bit and a residue voltage. The controller identifies a number of times to process the residue voltage through the one-bit converter stage to generate a number of additional output bits. The first output bit and the additional output bits are equal to the number of output bits required to generate a digital output with a selected conversion resolution. The residue voltage is iteratively processed through the one-bit converter for the number of times to generate the number of additional output bits.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
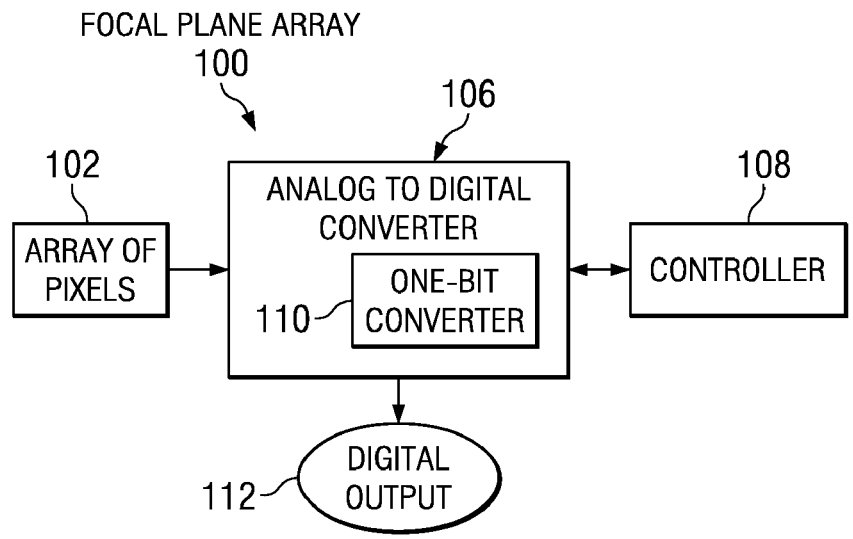
FIG. 1 is a block diagram of a focal plane array in which an advantageous embodiment may be implemented.

FIG. 1 is a block diagram of a focal plane array in which an advantageous embodiment may be implemented. Focal plane array 100 is a focal plane array with serial, variable bit width analog to digital converter. Array of pixels 102 is a plurality of picture elements. A picture element (pixel) is an element or single point in a graphic image.

An analog voltage generated by a pixel in array of pixels 102 is sent to analog to digital converter 106. Analog to digital converter 106 is an electronic integrated circuit that converts an analog signal received from the pixel into discrete, digital output. Analog to digital converter 106 utilizes a recursive topology of a serial gray folding converter to perform a single bit of data conversion within each baud rate bit period of the serial interface.

The upper limit of the serial baud rate is determined by the settling time of the single converter stage implemented by one-bit converter 110. One-bit converter 110 is a single bit converter stage for converting the analog signal into an output bit. The conversion can be terminated at any arbitrary number of bits. Therefore, the number of conversions/second is equal to the baud rate divided by the number of bits per conversion.

An analog signal is a continuous, analog input signal. One-bit converter 110 converts the input analog signal into an output bit and a residue voltage. Controller 108 comprises a dynamically adjustable conversion resolution which indicates the number of output bits that are required to generate a digital output voltage in the desired resolution. The dynamically adjustable conversion resolution is a conversion resolution that can be adjusted or changed by a user without physically replacing analog to digital converter 106, physically replacing parts associated with analog to digital converter 106, or altering a topology of analog to digital converter 106. The user selects a desired conversion resolution to form a selected conversion resolution. The output is generated at the selected conversion resolution by generating a number of bits needed for the selected conversion resolution. A higher resolution is generally a better quality or more detailed output than a lower resolution. Thus, the greater the resolution, the greater the number of bits is required to generate output at that resolution.

If one or more additional output bits are required to generate the digital output at the selected conversion resolution, controller 108 routes the residue voltage back through one-bit converter 110 to generate additional output bits. In other words, if an additional output bit is required to obtain a number of bits per pixel for the desired resolution, controller 108 routes the residue voltage back through one-bit converter 110 and converts the residue voltage into an additional output bit. This process is implemented recursively until the desired number of output bits per pixel is generated by one-bit converter 110.

In this example, controller 108 is a separate component from analog to digital converters 106. In another embodiment, controller 108 may be a component that is incorporated within analog to digital converter 106.

Thus, the conversion resolution is easily determined by simply reading out as many bits in the serial data stream as is needed for the selected gray scale resolution. In this manner, analog to digital converter 106 provides a solution to implementing a high speed analog to digital converter that utilizes a minimum amount of electronic circuitry with an easy serial interface.

Analog to digital converter 106 is a dynamically reconfigurable analog to digital converter having controller 108 and one-bit converter 110 dynamically configuring a conversion resolution. Analog to digital converter 106 is integrated into focal plane array 100 to enable a high-speed serial data stream output from a focal plane array camera, such as digital output 112. When the number of bits for the desired gray scale resolution is generated, the output bits are outputted as digital output 112. Digital output 112 an output with the selected conversion resolution. The selected conversion resolution is determined based on a selected gray scale resolution. Grayscale images are images composed of shades of gray varying from black to white. A grayscale resolution refers to the resolution of a grayscale image.

Thus, in this embodiment, focal plane array 100 allows the gray scale resolution of a camera associated with focal plane array 100 to be dynamically adjusted to truncate unnecessary data bits and maximize the efficiency of the data transfer allowing the camera to operate at higher frame rates.

Figure 2:
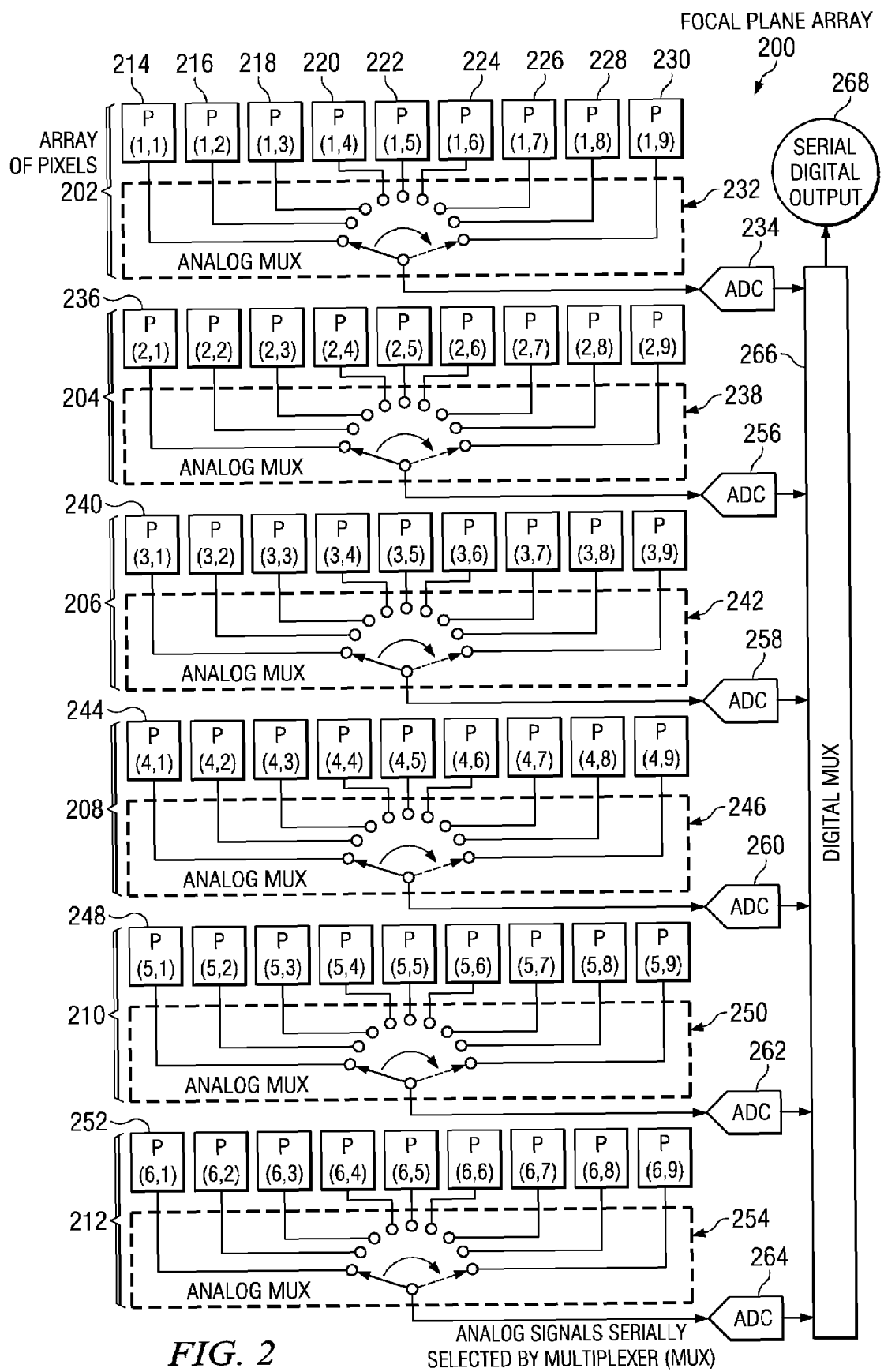
FIG. 2 is a block diagram of a dynamically reconfigurable focal plane array having a plurality of segments in accordance with an advantageous embodiment.

High frame rate cameras often segment the focal plane into regions, each with its own readout electronics. These readouts operate in parallel for maximum readout speed. FIG. 2 is a block diagram of a focal plane array having a plurality of segments in accordance with an advantageous embodiment. Focal plane array 200 is a focal plane array associated with a camera, such as focal plane array 100 in FIG. 1.

Focal plane array 200 includes a plurality of pixels in an array that is divided into a plurality of segments, such as segments 202-212. The array of pixels in each segment may be selected to allow convenient partitioning of the physical regions of the focal plane array. For example if the focal plane consists of a rectangular array of "N" by "M" pixels, the focal plane may be divided into four equal segments comprised of "N/2" by "M/2" pixels.

For the purpose of illustration, FIG. 2 shows an array of 54 pixels arranged in a rectangular array of six rows and nine columns. The pixels are represented as gray squares with indicia "P(N,M)" where "N" represents the pixel's row location and "M" represents the pixel's column location. In this example, the pixels of the focal plane array are partitioned into six segments comprised of an array of one by nine pixels. Segment 202 is associated with pixels 214-230, analog multiplexer (MUX) 232, and analog to digital converter 234.

An analog multiplexer is a component for routing the analog pixel voltage to an analog to digital converter. Analog multiplexers 232, 238, 242, 246, 250, and 254 may be implemented as any known or available analog multiplexer or a charge coupled device. The analog multiplexer in each segment, such as analog multiplexer 232 in segment 202, allows the analog voltage from a selected pixel in the segment to be routed to the analog to digital converter associated with that segment. For example, when pixel 214 in segment 202 is selected, the analog voltage from pixel 214 is directed to analog to digital converter 234 associated with segment 202 by analog multiplexer 232. Analog multiplexers 232, 238, 242, 245, 250, and 254 are devices for selecting one of many analog data sources and outputting that selected source into a single channel to an analog to digital converter associated with a given segment.

In this example, when pixel 214 in segment 202 is selected, pixel 236 in segment 204, pixel 240 in segment 206, pixel 244 in segment 208, pixel 248 in segment 210, and pixel 252 in segment 212, are also selected. Analog multiplexer 238 directs the analog voltage from pixel 236 to analog to digital converter 256 associated with segment 204. The analog voltage from pixel 240 is directed by analog multiplexer 242 to analog to digital converter 258 associated with segment 206. Analog multiplexer 246 directs the analog voltage from pixel 244 to analog to digital converter 260 associated with segment 208. The analog voltage from pixel 248 is directed from analog multiplexer 250 to analog to digital converter 262 associated with segment 210. The analog voltage from pixel 252 is directed from analog multiplexer 254 to analog to digital converter 264 associated with segment 212. In this manner, an analog voltage from a selected pixel in each segment is directed to an analog to digital converter associated with the given segment.

The most significant data bit of the converted pixel voltage from each region is presented to digital multiplexer 266. In other words, each of analog to digital converters 234, 256, 258, 260, 262, and 264 present a most significant data bit to digital multiplexer 266. Thus, the most significant data bits are received in parallel from analog to digital converters 234, 256, 258, 260, 262, and 264. These most significant data bits are clocked out of the serial data output port associated with digital multiplexer 266 as serial digital output 268. The next conversion bit is then presented to digital multiplexer 266. This process continues until the number of bits transmitted for the desired gray scale resolution is achieved.

The analog multiplexer in each segment then selects the next pixel for conversion, and the process repeats until all pixels have been addressed. In other words, analog to digital multiplexers for segments 202, 204, 206, 208, 210, and 212 each select a next pixel. An analog voltage from the selected pixel in each segment is then directed to analog to digital converters 234, 255, 258, 250, 252, and 254 associated with each given segment. Analog to digital converters 234, 256, 258, 260, 262, and 264 present a most significant bit to digital multiplexer 266 as parallel input. Digital multiplexer 266 then outputs serial digital output 268. The process continues iteratively until the number of bits transmitted for the desired gray scale resolution is generated. In this example, the desired gray scale resolution is a dynamically configurable gray scale resolution.

In another embodiment, an analog bucket brigade or charge coupled device may be used instead of an analog multiplexer to provide voltages from the pixels to the analog to digital converter associated with a given segment. In other words, analog to digital multiplexer 232 may be implemented as an analog to digital converter, an analog bucket brigade, or a charged coupled device.

In yet another embodiment, a parallel to serial converter may be used instead of digital multiplexer 266. In this example, the parallel to serial converter receives an output bit from each of analog to digital converters 234, 256, 258, 260, 262, and 264 in parallel. The parallel to serial converter converts the parallel bits into a serial data output signal. The analog multiplexer then selects a next pixel in the segment associated with the each analog to digital converter when a number of bits needed to generate digital output with the selected conversion resolution is generated for the first selected pixels.

Figure 3:
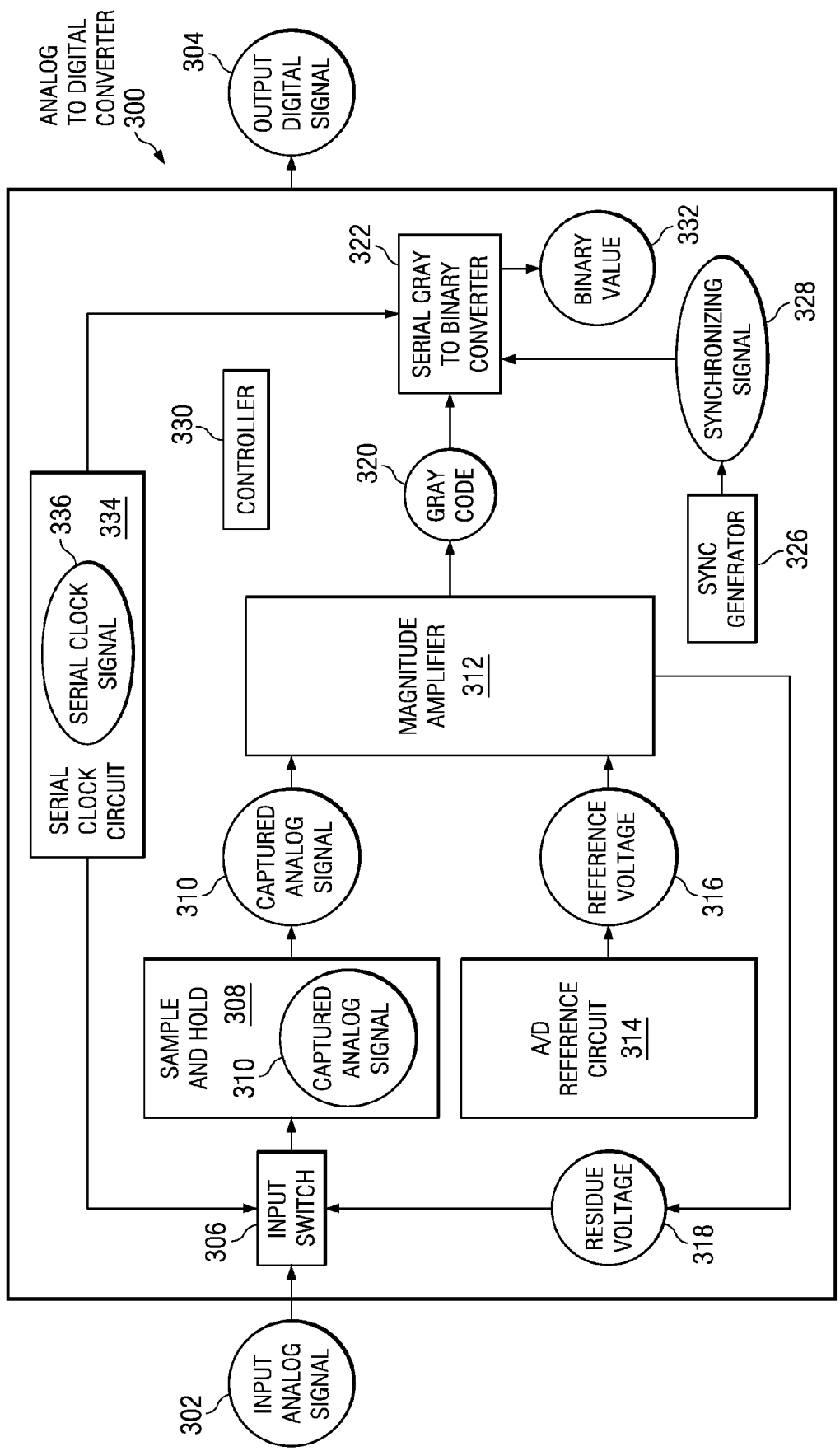
FIG. 3 is a block diagram of a signal flow through an analog to digital converter in accordance with an advantageous embodiment.

FIG. 3 is a block diagram of a signal flow through an analog to digital converter in accordance with an advantageous embodiment. Analog to digital converter 300 is integrated into the readout electronics of a focal plane array, such as focal plane array 100 in FIG. 1.

Analog to digital converter 300 has a dynamically reconfigurable conversion resolution for converting input analog signal 302 into output digital signal 304 at a desired gray scale resolution. Input analog signal 302 is a continuous analog signal that is received by input switch 306. Input switch 306 is a device for changing the course or flow of a circuit. Input switch 306 permits input analog signal 302 to flow into sample and hold 308 when input switch 306 is open.

Sample and hold 308 is a circuit that receives, captures, and holds input analog signal 302 to form captured analog signal 310. Magnitude amplifier 312 receives captured analog signal 310 from sample and hold 308.

Analog to digital (A/D) reference circuit 314 generates reference voltage 316. Magnitude amplifier 312 receives reference voltage 316 from analog to digital reference circuit 314. Magnitude amplifier 312 receives captured analog signal 310. Magnitude amplifier 312 performs a single bit Gray code conversion on captured analog signal 310 to generate residue voltage 318 and Gray code 320. Residue voltage 318 is routed back to input switch 306. Gray code 320 is routed to serial Gray to binary converter 322.

Sync generator 326 provides synchronizing signal 328 to serial Gray to binary converter 322. Serial Gray to binary converter 322 is a circuit for converting Gray code 320 into binary value 332. Serial Gray to binary converter 322 receives Gray code 320 from magnitude amplifier 312 and synchronizing signal 328 from sync generator 326. Serial Gray to binary converter 322 then converters Gray code 320 into binary value 332.

Serial clock circuit 334 provides serial clock signal 336 to input switch 306, sample and hold 308, and serial Gray to binary converter 322. Serial clock signal 336 is used to coordinate or synchronize the actions of multiple circuits.

Controller 330 is a device for dynamically configuring desired conversion resolutions. Controller 330 loops residue voltage 318 through the same one-bit converter stage for each subsequent output bit to control the conversion resolution of output digital signal 304. The greater the number of bits in output digital signal 304, the greater the resolution of output digital signal 304.

Unlike prior art analog to digital converters, analog to digital converter 300 "loops" residue voltage 318 through the same one-bit converter stage to generate each additional output bit that is needed to generate output digital signal 304 at the selected conversion resolution. Therefore the electronic circuitry, silicon resources and power consumption is minimal. In other words, analog to digital converter 300 uses fewer electronic circuitry components, consumes less power, and takes less physical die area on an application specific integrated circuit. The analog to digital conversion latency is shorter than existing designs, and the conversion resolution and sample rate can be dynamically varied.

Figure 4:
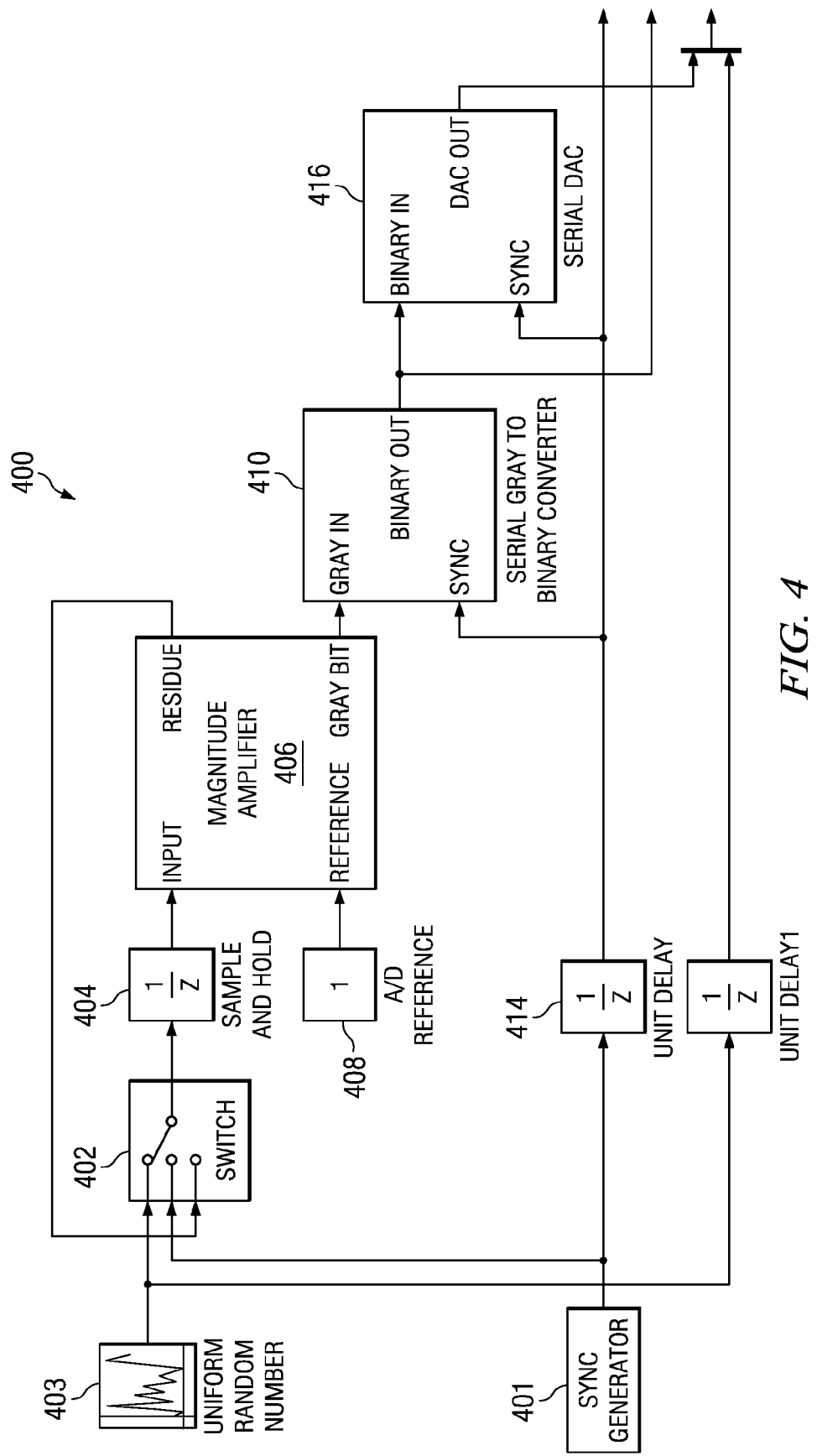
FIG. 4 is a circuit diagram illustrating a topology for an analog to digital converter in accordance with an advantageous embodiment.

Turning now to FIG. 4, a circuit diagram illustrating a topology for an analog to digital converter is shown in accordance with an advantageous embodiment. Circuit diagram 400 illustrates an analog to digital converter with dynamically adjustable conversion resolution, such as analog to digital converter 300 in FIG. 3.

Sync generator 401 produces a synchronizing signal which begins a conversion. Switch 402 is an input switch, such as input switch 306 in FIG. 3. Switch 402 selects the random analog voltage to be converted from the selected pixel which is represented in FIG. 3 by a uniform random number generator 403. This voltage is then captured by sample and hold 404.

Magnitude amplifier 406 is a magnitude amplifier, such as magnitude amplifier 312 in FIG. 3. Magnitude amplifier 406 receives the sampled voltage and a reference voltage from A/D reference 408. A/D reference 408 is an analog to digital (A/D) reference circuit, such as analog to digital reference circuit 314 in FIG. 3, which generates the reference voltage. Magnitude amplifier 406 then performs the single bit Gray code conversion of the sampled voltage, and the residue voltage is routed back to switch 402. At the next clock cycle when sync generator 401 output goes low, switch 402 selects the residue voltage for sample and hold. Magnitude amplifier 406 then performs a conversion of the residue voltage during each subsequent clock cycle.

Serial Gray to binary converter 410 performs a serial, bit by bit conversion of the Gray code output from magnitude amplifier 406 into a binary format. Because sample and hold 404 element delays the Gray code output of magnitude amplifier by one clock cycle, unit delay 414 is introduced on the output of sync generator 401 so that the sync signal arrives at serial Gray to binary converter 410 at the same time as the first Gray code bit from magnitude amplifier 406. For the purpose of demonstration, serial digital to analog converter 416 block has been included to show that the binary out signal represents the converted analog voltage.

Figure 5:
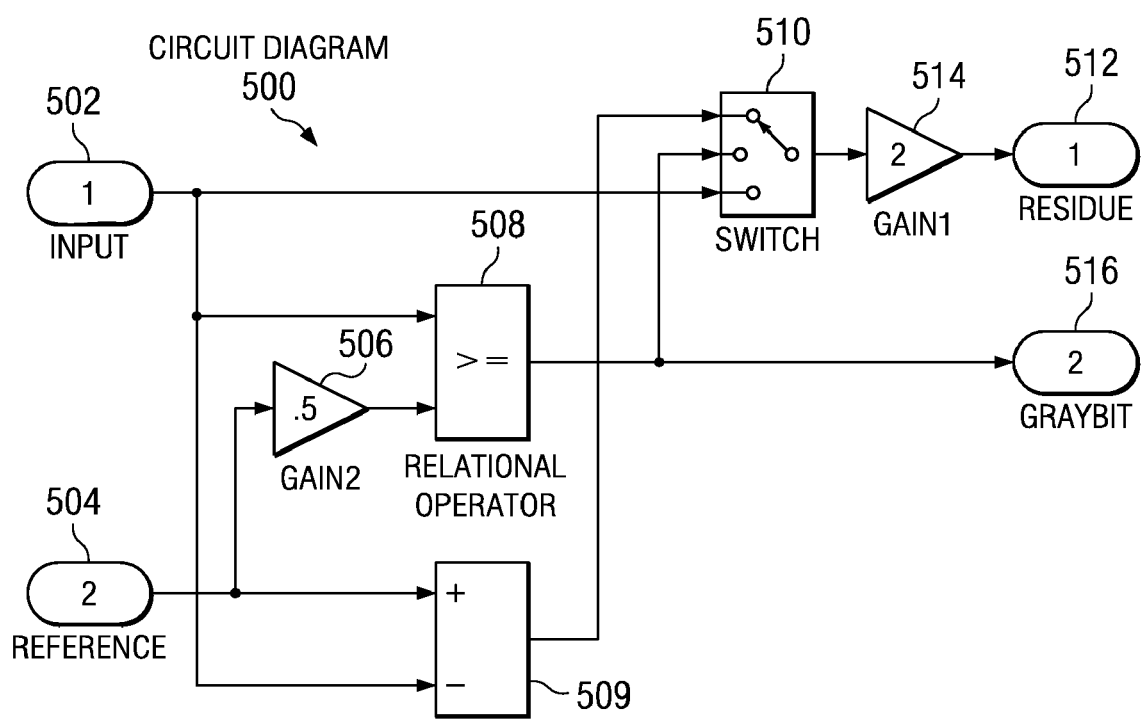
FIG. 5 is a circuit diagram illustrating a topology of a magnitude amplifier in accordance with an advantageous embodiment.

FIG. 5 is a circuit diagram illustrating a topology of a magnitude amplifier in accordance with an advantageous embodiment. Circuit diagram 500 is a magnitude amplifier, such as magnitude amplifier 312 in FIG. 3. The magnitude amplifier receives an input analog signal 502 from a sample and hold circuit. The magnitude amplifier also receives reference threshold voltage 504 from an analog to digital reference circuit, such as analog to digital (A/D) reference circuit 314 in FIG. 3.

Gain2 506 is a gain of 0.5 amplifier. Gain2 506 increases a signal amplitude by a ratio of 0.5 of output to input. Relational operator 508 compares signal values. Arithmetic operator 509 subtracts the value of input analog signal 502 from reference threshold voltage 504. If a signal value of input analog signal 502 is greater than or equal to one half the value of reference threshold voltage 504, the relational operator 508 generates a boolean true signal which produces a "1" for the gray code bit output 514, and causes switch 510 to select the output of arithmetic operator 509. A signal value of input analog signal 502 which is less than one half of the threshold voltage causes relational operator 508 to output a boolean false signal which produces a "0" for gray code bit output 514, and causes switch 510 to select input analog signal 502.

Depending on the boolean output of relational operator 508, switch 510 selects either input analog signal 502 or the processed signal from arithmetic operator 509 to send to Gain 1 514. Gain1 514 is a gain of two amplifier. Gain1 514 has a 2.0 ratio of output to input increase in signal amplitude of residue voltage 512 produced by the magnitude amplifier. Magnitude amplifier 500 generates Gray code bit (graybit) 516 and residue voltage 512.

Figure 6:
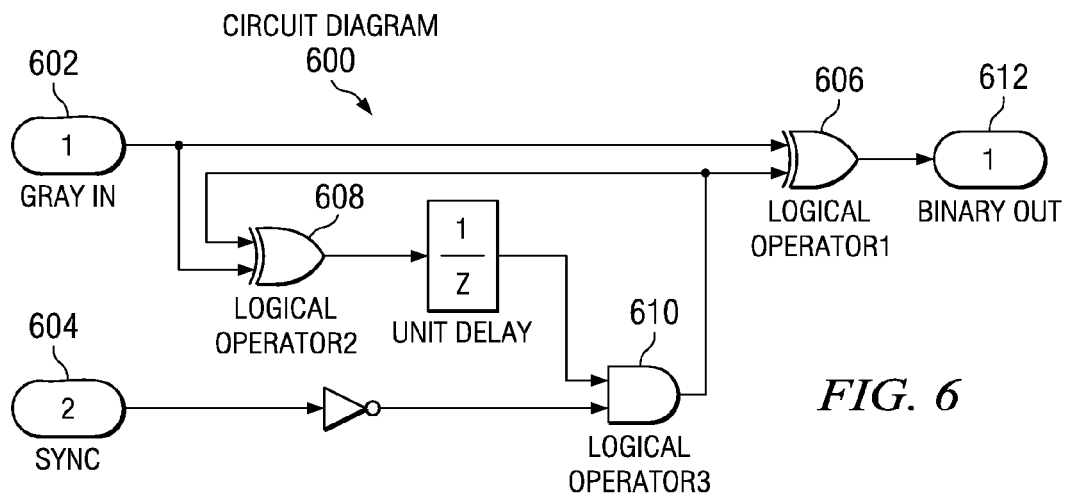
FIG. 6 is a circuit diagram illustrating a topology of a serial gray to binary converter in accordance with an advantageous embodiment.

FIG. 6 is a circuit diagram illustrating a topology of a serial gray to binary converter in accordance with an advantageous embodiment. Circuit diagram 600 is a representation of a serial Gray to binary converter, such as serial Gray to binary converter 322 in FIG. 3. The serial Gray to binary converter receives input Gray code 602 from a magnitude amplifier, such as magnitude amplifier 312 in FIG. 3. The serial Gray to binary converter also receives a synchronizing signal 604 from a sync generator.

Logical operator 1 606 and logical operator 2 608 are exclusive "or" logical operators. Logical operators 606 and 608 performs a logical operation on two operands and produces a "true" result only if exactly one of the two operands has a value of true. Logical operator 3 610 is an "and" logical operator. Logical operator 3 610 returns a "true" result if both operands has a value of true. Thus, the serial Gray to binary converter generates binary output 612 using input Gray code 602 and synchronizing signal 604.

Figure 7:
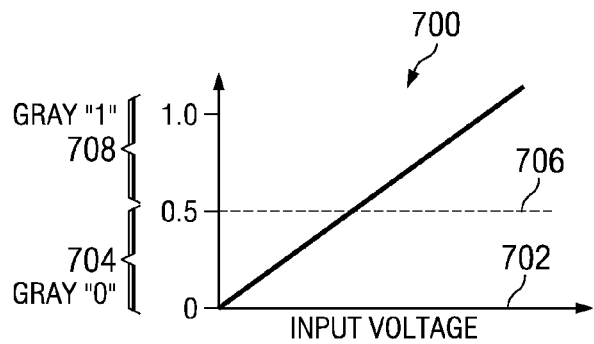
FIG. 7 is a graph illustrating a threshold for producing Gray bits in a magnitude amplifier for producing Gray bits in accordance with an advantageous embodiment.
Figure 8:
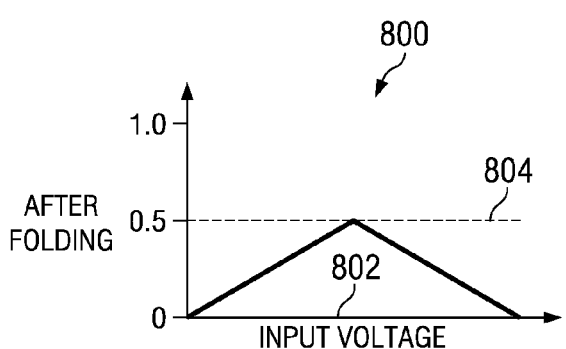
FIG. 8 is a graph illustrating processing of the input voltage in accordance with an advantageous embodiment.
Figure 9:
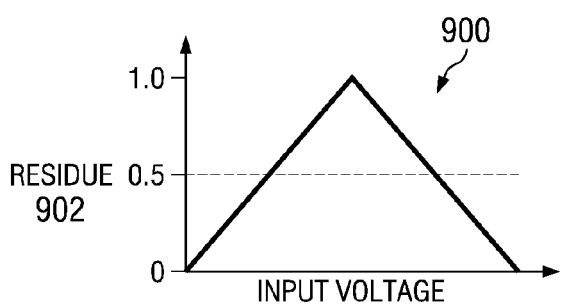
FIG. 9 is a graph illustrating residue output voltage of a magnitude amplifier in accordance with an advantageous embodiment.

FIGS. 7-9 illustrates the operation of a unipolar magnitude amplifier, such as magnitude amplifier 312 in FIG. 3. Turning now to FIG. 7, a graph illustrating a threshold for producing Gray bits in a magnitude amplifier in accordance with an advantageous embodiment. The input to a magnitude amplifier is a voltage signal ranging from 0 to 1 (full scale). The magnitude amplifier produces a boolean Gray code bit and a residue voltage signal determined by the input voltage signal. Graph 700 shows the range of input voltage 702 where the input voltage produces a Gray bit "0" 704 if it is below threshold 706, and a Gray bit "1" 708 if the input voltage is above the threshold. Threshold 706 is set to ½ of the full scale.

FIG. 8 is a graph illustrating processing of the input voltage in accordance with an advantageous embodiment. Graph 800 shows the processing of input voltage 802 such that an input voltage above threshold 804 value is "folded" about the threshold axis value.

Turning now to FIG. 9, a graph illustrating residue output voltage of a magnitude amplifier is depicted in accordance with an advantageous embodiment.

Graph 900 shows residue output voltage 902 of the magnitude amplifier which is the folded and processed voltage multiplied by a factor of 2.

Figure 10:
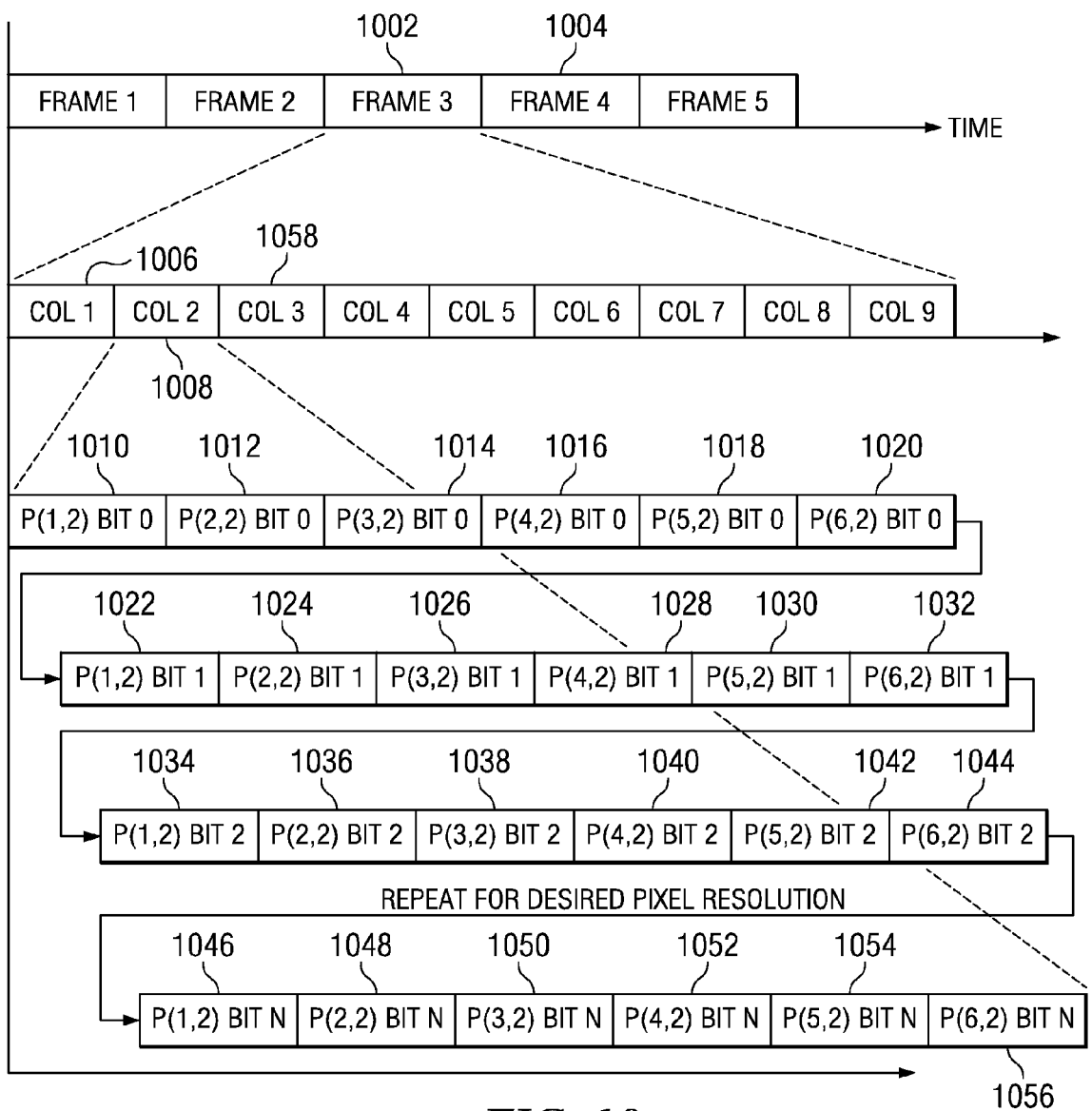
FIG. 10 is a block diagram illustrating a process for generating a number of bits for a desired gray scale resolution using a given array of pixels in accordance with an advantageous embodiment.

FIG. 10 is a block diagram illustrating a process for generating a number of bits for a desired gray scale resolution using a given array of pixels in accordance with an advantageous embodiment such as in focal plane array 200 shown in FIG. 2. The serial digital output 268 of FIG. 2 is comprised of a sequence of data representative of the image generated from a plurality of pixels in focal plane array 200. Each complete set of image data is referred to as a frame. Subsequent frames represent the time progression of the image data. Frame 3 1002 is the image data generated by a plurality of pixels in an array of pixels at a particular moment in time. Frame 4 1004 is the image data generated by the plurality of pixels in the array of pixels at a different moment in time. The array of pixels is partitioned into segments. In the example shown in FIG. 2, each segment is comprised of a single row of pixels in the array.

A first pixel is selected from each segment in the plurality of segments. In this example, the selected pixels are pixels P(1,1), P(2,1), P(3,1), P(4,1), P(5,1) and P(5,1). These pixels comprise the first column of the focal plane array. The analog image data from column one 1006 is converted by the analog to digital converters and outputted as a digital block of data representative of column one 1006 image data. The next pixel is then selected from each segment. Second column 1008 of the focal plane array comprises pixels P(1,2), P(2,2,) P(3,2), P(4,2), P(5,2), and P(6,2). Each of these selected pixels is processed in a one-bit converter stage of an analog to digital converter associated with the segment to form an output bit, such as one-bit converter 110 in FIG. 1. The first conversion bit from each segment is presented to the digital multiplexer, such as digital multiplexer 266 in FIG. 2. Digital multiplexer 266 is a component for generating a serial data stream from the outputs of analog to digital converters. Digital multiplexer 266 may be implemented as any type of known or available digital multiplexer or parallel to serial converter.

The multiplexer outputs each bit from each segment as the serial digital output, such as serial digital output 268 in FIG. 2. For example, the analog voltage from the selected pixel in each segment is processed through a one-bit converter stage in an analog to digital converter to form bit 0, such as BIT 0 and a residue voltage. These bits are shown as P(1,2) BIT 0 1010, P(2,2,) BIT 0 1012, P(3,2) BIT 0 1014, P(4,2) BIT 0 1016, P(5,2) BIT 0 1018, and P(6,2) BIT 0 1020.

Figure 11:
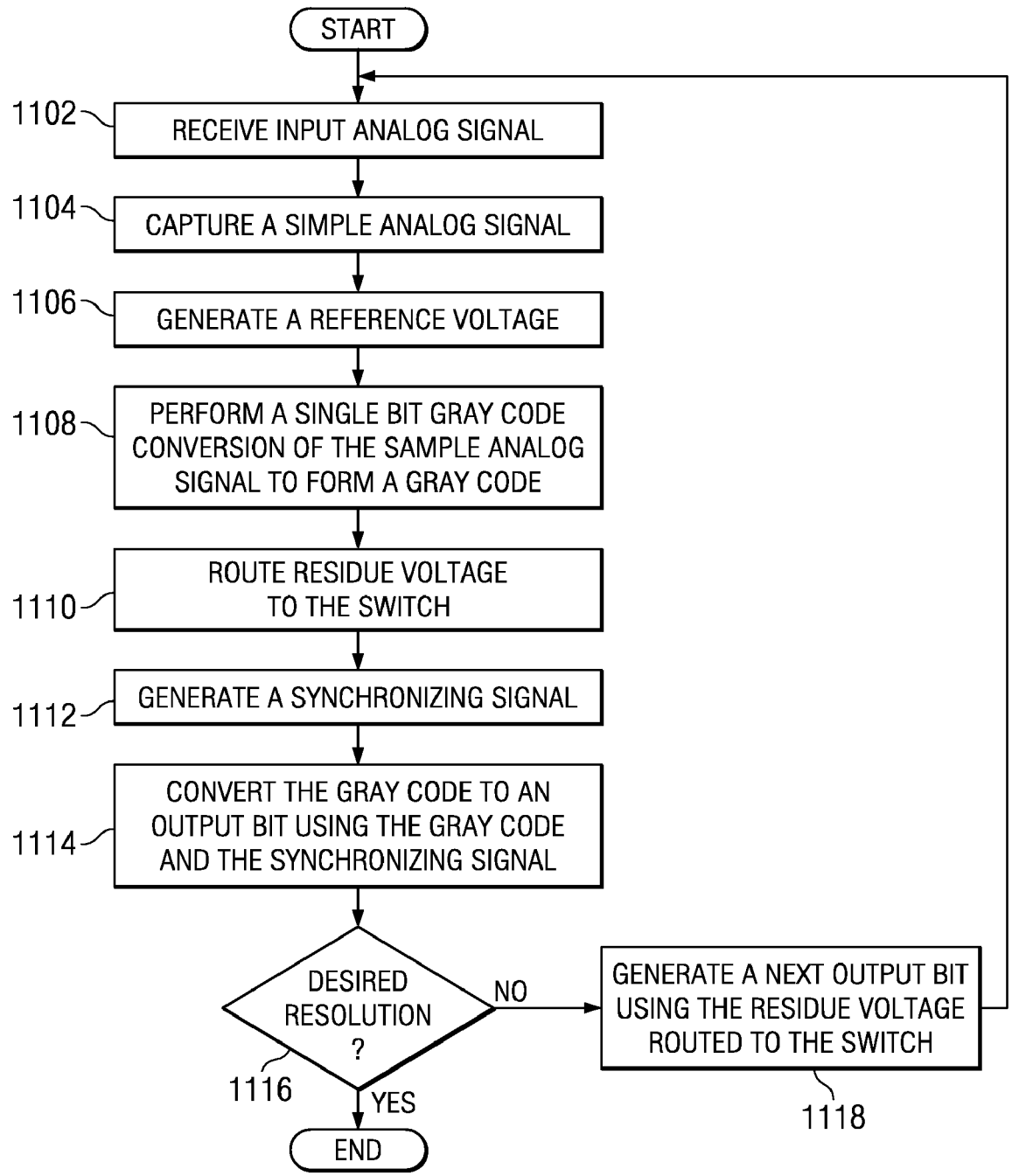
FIG. 11 is a flowchart illustrating a process for converting an analog signal to a digital signal in accordance with an advantageous embodiment.

The residue voltage is then routed back through the one-bit converter stage of the analog to digital converter to generate a second bit, Bit 1 and a new residue voltage. These bits are shown in FIG. 11 as P(1,2)BIT1 1022, P(2,2,) BIT 1 1024, P(3,2) BIT 1 1026, P(4,2) BIT1 1028, P(5,2) BIT1 1030, P(6,2) BIT1 1032. The second conversion bit from each segment is again presented to the digital multiplexer.

The residue voltage is again routed back through the one-bit converter stage by the analog to digital converter controller to generate a third bit, bit 2. These bits are shown in FIG. 10 as P(1,2) BIT 2 1034, P(2,2,) BIT 2 1036, P(3,2,) BIT 2 1038, P(4,2,) BIT 2 1040, P(5,2) BIT 2 1042 and P(6,2) BIT 2 1044.

This process continues until the "N" number of bits, bit N 1112, required for the desired gray scale resolution is generated. The bit N is shown in FIG. 10 as P(1,2) BIT N 1046, P(2,2,) BIT N 1048, P(3,2,) BIT N 1050, P(4,2,) BIT N 1052, P(5,2) BIT N 1054 and P(6,2) BIT N 1056.

A next pixel for conversion is then selected from each segment comprising column 3 1058. The process iteratively converts the voltage for the next pixel into output bits until the "N" number of bits required for the desired gray scale resolution is generated for the next pixel. This process continues until all of the pixels have been converted into the appropriate number of output bits for the desired gray scale resolution.

FIG. 11 is a flowchart illustrating a process for converting an analog signal to a digital signal in accordance with an advantageous embodiment. The process in FIG. 11 is implemented by an analog to digital converter, such as analog to digital converter 100 in FIG. 1, analog to digital converter 200 in FIG. 2, or analog to digital converter 300 in FIG. 3.

The process begins by receiving an analog signal (operation 1102). The process captures a sample input analog signal (operation 1104). The process generates a reference voltage (operation 1106). The process performs a single bit Gray code conversion of the sample analog signal to form a Gray code (operation 1108). The process routes the residue voltage to the switch (operation 1110).

The process generates a synchronizing signal (operation 1112). The process converts the Gray code to an output bit using the Gray code and the synchronizing signal (operation 1114). The process makes a determination as to whether a number of bits required for a desired resolution have been generated (operation 1116). If the desired resolution has been reached, the process terminates thereafter. If the desired resolution has not been reached at operation 1116, the process generates a next output bit using the residue voltage routed to the switch (operation 1118). The process iteratively performs operations 1102-1115 until the number of bits needed to reach the desired resolution has been generated.

Figure 12:
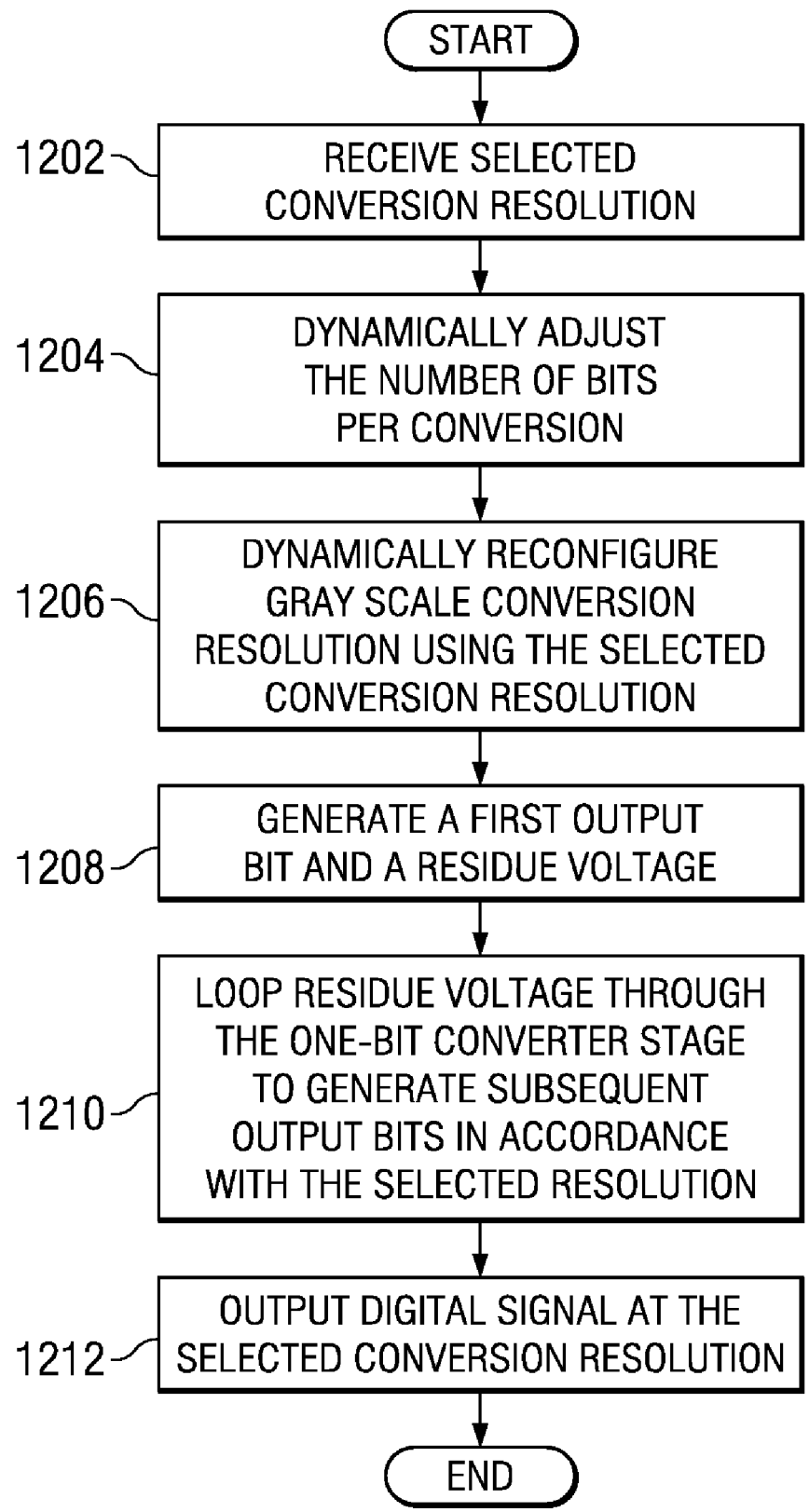
FIG. 12 is a flowchart illustrating a process for dynamically reconfiguring conversion resolution in an analog to digital converter in accordance with an advantageous embodiment.

FIG. 12 is a flowchart illustrating a process for dynamically reconfiguring conversion resolution in an analog to digital converter in accordance with an advantageous embodiment. The process in FIG. 12 is implemented by an analog to digital converter, such as analog to digital converter 100 in FIG. 1, analog to digital converter 200 in FIG. 2, or analog to digital converter 300 in FIG. 3.

The process receives a selected conversion resolution (operation 1202). The process dynamically reconfigures the sample rate by dynamically adjusting the number of bits per conversion (operation 1204). The process dynamically reconfigures conversion resolution using the selected conversion (operation 1206). The process generates a first output bit and a residue voltage (operation 1208). The process loops the residue voltage through the one-bit converter stage to generate subsequent output bits in accordance with the selected resolution (operation 1210). The process outputs the digital signal at the selected conversion resolution (operation 1212) with the process terminating thereafter.

Figure 13:
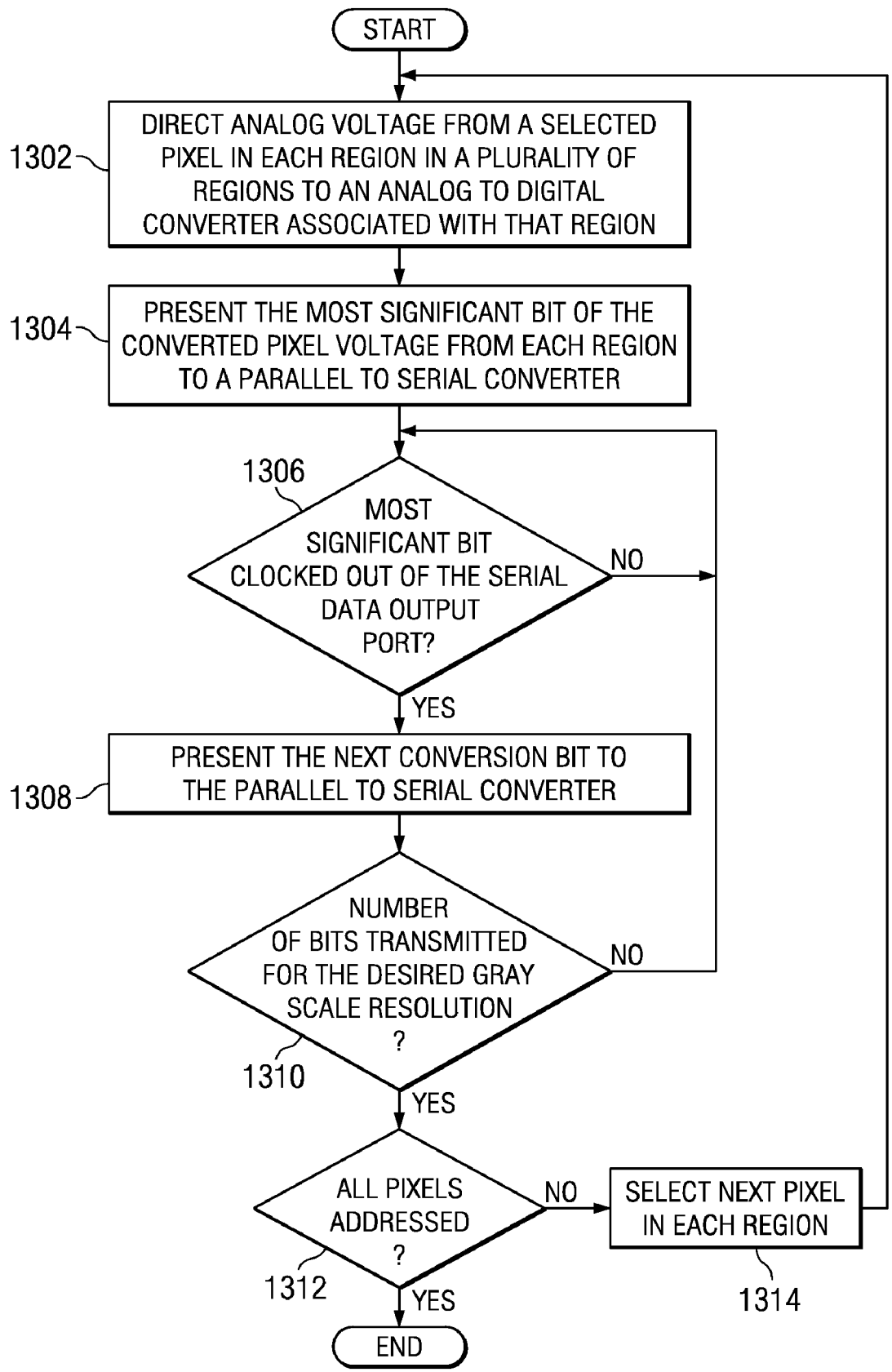
FIG. 13 is a flowchart illustrating a process for generating serial output by a dynamically reconfigurable focal plane array in accordance with an illustrative embodiment.

FIG. 13 is a flowchart illustrating a process for generating serial output by a dynamically reconfigurable focal plane array in accordance with an illustrative embodiment. The process in FIG. 13 is implemented by a focal plane array, such as focal plane array 200 in FIG. 2.

The process directs an analog voltage from a selected pixel in each region in a plurality of regions to an analog to digital converter associated with each region (operation 1302). The process presents the most significant bit of the converted pixel voltage from each region to a parallel to serial converter (operation 1304). The process makes a determination as to whether the most significant bit clocked out of the serial data output port (operation 1306). If the most significant bit did not clock out of the serial data output port, the process returns to operation 1306. When the most significant bit does clock out of the serial data output port, the process presents the next conversion bit to the parallel to serial converter (operation 1308). The process makes a determination as to whether the number of bits for the desired gray scale resolution has been transmitted (operation 1310). If the number of bits for the desired resolution has not been transmitted, the process returns to operation 1306 and iteratively generates bits for the selected pixel in each region until the desired number of bits are generated and transmitted.

When the number of bits for the desired gray scale resolution are transmitted, the process then makes a determination as to whether all the pixels have been addressed (operation 1312). If all the pixels have not been converted into the appropriate number of bits for the desired resolution, the process selects a next pixel in each region (operation 1314) and iteratively performs operations 1302-1314 until all the pixels associated with the focal plane array have been converted to the number of bits needed for the desired gray scale resolution. When all the pixels have been converted into the appropriated number of bits for the desired resolution at operation 1312, the process terminates thereafter.

Thus, an embodiment of the present disclosure provides a dynamically reconfigurable focal plane array. The dynamically reconfigurable focal plane array includes a plurality of segments, a plurality of analog to digital converters with dynamically reconfigurable conversion resolution, a parallel to serial converter, a controller, and at least one analog multiplexer.

Each segment in the plurality of segments comprises at least one pixel. Each analog to digital converter in the plurality of analog to digital converters is associated with a segment in the plurality of segments. Each analog to digital converter receives an analog voltage from a first selected pixel in the segment associated with the each analog to digital converter. The parallel to serial converter receives an output bit from the each analog to digital converter in the plurality of analog to digital converters in parallel.

The parallel to serial converter generates a serial data output signal. The controller dynamically configures a selected conversion resolution of the each analog to digital converter. The analog multiplexer selects a next pixel in the segment associated with the each analog to digital converter when a number of bits needed to generate digital output with the selected conversion resolution is generated for the first selected pixel.

In another advantageous embodiment, a dynamically reconfigurable focal plane array is provided. The focal plane array includes a plurality of pixels, an analog to digital converter, and a controller. A pixel in the plurality of pixels generates an analog voltage. The analog to digital converter receives the analog voltage from the pixel.

In this embodiment, the analog to digital converter includes a sample and hold circuit and a one-bit converter stage. The sample and hold circuit holds the analog voltage to form a captured analog signal. The one-bit converter stage generates a first output bit and a residue voltage in response to processing the captured analog signal. The one-bit converter stage iteratively processes the residue voltage a given number of times to form a given number of additional bits. The first output bit and the given number of additional bits form a digital output with a dynamically reconfigurable conversion resolution.

The controller identifies a number of output bits required to generate the digital output at the dynamically reconfigurable conversion resolution. The controller iteratively processes the captured analog signal and the residue voltage through the one-bit converter stage to generate the number of output bits to form the digital output with the dynamically reconfigurable conversion resolution.

In yet another advantageous embodiment, a method for dynamically reconfiguring a gray scale resolution of digital output generated by a focal plane array is provided. A controller identifies a number of output bits required to generate a digital output with a selected conversion resolution. An analog to digital converter receives an analog voltage from a first selected pixel in a plurality of pixels. A sample and hold circuit associated with the analog to digital converter holds the analog voltage to form a captured analog signal. The captured analog signal is processed through a one-bit converter stage to form a first output bit and a residue voltage. The controller identifies a number of times to process the residue voltage through the one-bit converter stage to generate a number of additional output bits. The first output bit and the additional output bits are equal to the number of output bits required to generate a digital output with a selected conversion resolution. The residue voltage is iteratively processed through the one-bit converter for the number of times to generate the number of additional output bits.

The disclosure integrates a dynamically reconfigurable serial flash analog to digital converter topology into the readout electronics of a focal plane array camera, and allows dynamic control of gray scale resolution. The focal plane array with serial, variable bit width analog to digital converter allows a tradeoff between gray scale resolution and video frame rate of a camera within the available bandwidth of the data link while simplifying overall system architecture.

Existing focal plane array designs that incorporate analog to digital converters in readout electronics use topologies that are typically fixed in data width, have longer conversion times, and consume more power. The focal plane array of the advantageous embodiments incorporate a dynamically reconfigurable analog to digital converter having a single one-bit converter stage into the focal plane array readout to minimize the analog signal path and reduce noise susceptibility. The small size and low power of the dynamically reconfigurable analog to digital converters make it possible to add this functionality to cooled focal plane arrays. The analog to digital converter uses a minimum amount of electronics, die area, and power consumption.

The focal plane array with serial, variable bit width analog to digital converter provides the ability to change the number of bits per pixel thereby permitting the user to trade gray scale resolution for increased frame rate without exceeding the existing bandwidth of the data link. The focal plane array with the dynamically reconfigurable analog to digital converter has a fast conversion rate and its output is serial making it easy to interface to existing high speed serial data links. Also, the number of conversion bits, hence the gray scale resolution, is reconfigurable on-the-fly as needed by the application.

The small die size of the analog to digital converters allows them to be integrated into the focal plane readout electronics of a camera and other sensor devices. This integration simplifies system architecture. The number of bits per conversion, and hence the gray scale resolution, can be dynamically controlled as required by a particular application. By reducing the gray scale resolution, the frame rate can be increased while maintaining the same data bandwidth. In addition, the low power consumption of the analog to digital converters allow them to be integrated into the readout electronics of infrared cooled focal plane array cameras.

Moreover, the focal plane array with dynamically reconfigurable conversion resolution may reduce the cost of video cameras and provide capabilities for scientific cameras that do not currently exist. For example, the focal plane array of the advantageous embodiments may simplify support electronics and interfaces in infrared cameras, and sensing devices utilized for laser pointing and tracking, and wavefront sensing. Thus, the focal plane array may reduce cost, lighten payloads, decrease size and increase functionality of camera based electro-optic systems.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A dynamically reconfigurable focal plane array, the dynamically reconfigurable focal plane array comprising:
   a plurality of segments, wherein each segment comprises at least one pixel;
   a plurality of analog to digital converters with dynamically reconfigurable conversion resolution, wherein each analog to digital converter in the plurality of analog to digital converters is associated with a segment in the plurality of segments, and wherein the each analog to digital converter receives an analog voltage from a first selected pixel in the segment associated with the each analog to digital converter;
   a parallel to serial converter, wherein the parallel to serial converter receives an output bit from the each analog to digital converter in the plurality of analog to digital converters in parallel, and wherein the parallel to serial converter generates a serial data output signal;
   a controller, wherein the controller dynamically configures a selected conversion resolution of the each analog to digital converter; and
   an analog multiplexer, wherein the analog multiplexer selects a next pixel in the segment associated with the each analog to digital converter when a number of bits needed to generate digital output with the selected conversion resolution is generated for the first selected pixel.

2. The focal plane array of claim 1 wherein the selected conversion resolution is determined based on a selected gray scale resolution.

3. The focal plane array of claim 1 wherein the controller identifies a number of output bits required to generate the digital output at the selected conversion resolution.

4. The focal plane array of claim 3 wherein each analog to digital converter in the plurality of analog to digital converters further comprises:
   a sample and hold circuit, wherein the sample and hold circuit receives the analog voltage from the pixel and holds the analog voltage to form a captured analog signal; and
   a one-bit converter stage, wherein the one-bit converter stage generates a first output bit and a residue voltage in response to processing the captured analog signal, and wherein the one-bit converter stage iteratively processes the residue voltage a given number of times to form a given number of additional bits, wherein the first output bit and the given number of additional bits equal the number of output bits required to generate the digital output at the selected conversion resolution.

5. The focal plane array of claim 4 wherein the selected conversion resolution is a first gray scale resolution, and wherein the gray scale resolution is reduced to increase a frame rate while maintaining a same data bandwidth to form a second gray scale resolution.

6. The focal plane array of claim 5 wherein the controller identifies a number of output bits required to generate the digital output at the second gray scale resolution, wherein the second gray scale resolution is a different resolution than the first gray scale resolution; and wherein the one-bit converter stage iteratively processes the residue voltage through the one-bit converter for a number of times required to generate a number of additional output bits, wherein the first output bit and the number of additional output bits equals the number of output bits required to generate the digital output at the second gray scale resolution.

7. The focal plane array of claim 1 wherein the focal plane array is associated with a camera, wherein the camera provides dynamic gray scale adjustability.

8. The focal plane array of claim 1 wherein the focal plane array is associated with a communications device.

9. A dynamically reconfigurable focal plane array, the dynamically reconfigurable focal plane array comprising:
   a plurality of pixels, wherein a pixel in the plurality of pixels generates an analog voltage;

an analog to digital converter with dynamically reconfigurable conversion resolution, wherein the analog to digital converter receives the analog voltage from the pixel, and wherein the analog to digital converter comprises:
  a sample and hold circuit, wherein the sample and hold circuit holds the analog voltage to form a captured analog signal; and
  a one-bit converter stage, wherein the one-bit converter stage generates a first output bit and a residue voltage at a first clock cycle in response to processing the captured analog signal, wherein the one-bit converter stage iteratively processes the residue voltage a given number of times to form a given number of additional bits, wherein each time in the given number of times is a subsequent clock cycle, and wherein the first output bit and the given number of additional bits form a digital output with a dynamically reconfigurable conversion resolution; and
a controller, wherein the controller identifies a number of output bits required to generate the digital output at the dynamically reconfigurable conversion resolution, and wherein the controller iteratively processes the captured analog signal and the residue voltage through the one-bit converter stage to generate the number of output bits to form the digital output with the dynamically reconfigurable conversion resolution.

10. The focal plane array of claim 9 wherein the selected conversion resolution is determined based on a selected gray scale resolution.

11. The focal plane array of claim 9 wherein the selected conversion resolution is a first conversion resolution, and wherein the first conversion resolution is reduced to increase a frame rate while maintaining a same data bandwidth to form a second conversion resolution.

12. The focal plane array of claim 9 wherein the controller identifies a second number of output bits required to generate digital output with a second dynamically reconfigurable conversion resolution, and wherein the one-bit converter stage processes the residue voltage a number of times required to generate additional output bits, wherein the first output bit and the additional output bits equal the second number of output bits required to form the digital output at the second conversion resolution.

13. A method for dynamically reconfiguring a gray scale resolution of digital output generated by a focal plane array, the method comprising:
  identifying, by a controller, a number of output bits required to generate a digital output with a selected conversion resolution;
  receiving, by an analog to digital converter, an analog voltage from a first selected pixel in a plurality of pixels;
  capturing the analog voltage by a sample and hold circuit associated with the analog to digital converter, to form a captured analog signal;
  processing the captured analog signal through a one-bit converter stage to form a first output bit and a residue voltage;
  identifying a number of times to process the residue voltage through the one-bit converter stage to generate a number of additional output bits, wherein the first output bit and the additional output bits are equal to the number of output bits required to generate a digital output with a selected conversion resolution; and
  iteratively processing the residue voltage through the one-bit converter for the number of times to generate the number of additional output bits.

14. The method of claim 13 further comprising:
  responsive to generating the number of output bits required to generate a digital output with a selected conversion resolution for the first selected pixel, selecting a next pixel, wherein an analog signal generated by the next pixel is processed through the one-bit converter to generate number of output bits required to generate the digital output with the selected conversion resolution.

15. The method of claim 13 wherein an analog voltage generated by each pixel in the plurality of pixels is processed through the one-bit converter stage a given number of times required to generate the number of output bits to form the digital output with the selected conversion resolution.

16. The method of claim 13 wherein the selected conversion resolution is determined based on a selected gray scale resolution.

17. The method of claim 13 wherein each time the residue voltage is processed through the one-bit converter stage, a single output bit is generated.

18. The method of claim 13 wherein the analog to digital converter is a first analog to digital converter, and wherein focal plane array further comprises:
  a plurality of segments, wherein each segment in the plurality of segments comprises at least one pixel, and wherein the first selected pixel is a pixel in a segment in the plurality of segments; and
  a plurality of analog to digital converters, wherein each analog to digital converter in the plurality of analog to digital converters is associated with a segment in the plurality of segments, and wherein the first analog to digital converter is an analog to digital converter in the plurality of analog to digital converters.

19. The method of claim 18 further comprising:
  receiving a digital signal output from each analog to digital converter in the plurality of analog to digital converters in parallel to form parallel digital output; and
  converting the parallel digital output to serial digital output by a parallel to serial converter.

20. The method of claim 13 wherein the selected conversion resolution is a first selected conversion resolution, and further comprising:
  responsive to receiving a second selected conversion resolution, identifying, by the controller, a number of output bits required to generate the digital output with the second selected conversion resolution, wherein the second selected conversion resolution is a different resolution than the first selected conversion resolution;
  identifying a number of times to process the residue voltage through the one-bit converter stage to generate a number of additional output bits, wherein the first output bit and the additional output bits are equal to the number of output bits required to generate the digital output with the second selected conversion resolution; and
  iteratively processing the residue voltage through the one-bit converter for the number of times to generate the number of additional output bits to form the digital output with the second selected conversion resolution.

* * * * *